(12) United States Patent
Yu et al.

(10) Patent No.: US 8,275,009 B2
(45) Date of Patent: Sep. 25, 2012

(54) GREEN LASER GENERATION DEVICE, AND PORTABLE ELECTRONIC MACHINE HAVING LASER PROJECTION DISPLAY USING THE SAID DEVICE

(75) Inventors: Nan-Ei Yu, Gwangju (KR); Do-Kyeong Ko, Gwangju (KR); Chang-Soo Jung, Gwangju (KR); Yeung-Lak Lee, Gwangju (KR); Bong-Ahn Yu, Gwangju (KR); Jeong-Soo Kim, Gwangju (KR)

(73) Assignee: Gwangju Institute of Science and Technology, Gwangju (KR)

( * ) Notice: Subject to any disclaimer, the term of this patent is extended or adjusted under 35 U.S.C. 154(b) by 0 days.

(21) Appl. No.: 12/812,443

(22) PCT Filed: Oct. 13, 2008

(86) PCT No.: PCT/KR2008/006014
§ 371 (c)(1),
(2), (4) Date: Jul. 9, 2010

(87) PCT Pub. No.: WO2009/096653
PCT Pub. Date: Aug. 6, 2009

(65) Prior Publication Data
US 2010/0290488 A1    Nov. 18, 2010

(30) Foreign Application Priority Data

Jan. 28, 2008    (KR) .................. 10-2008-0008582

(51) Int. Cl.
*H01S 3/10* (2006.01)
(52) U.S. Cl. ........................................ 372/22
(58) Field of Classification Search ............. 372/22
See application file for complete search history.

(56) References Cited

U.S. PATENT DOCUMENTS

| | | | | |
|---|---|---|---|---|
| 5,164,947 A * | 11/1992 | Lukas et al. | .................. | 372/22 |
| 6,333,943 B1 * | 12/2001 | Yamamoto et al. | ........ | 372/43.01 |
| 7,003,006 B2 | 2/2006 | You et al. | | |
| 7,260,133 B2 | 8/2007 | Lei et al. | | |
| 2005/0063441 A1 * | 3/2005 | Brown | ............................ | 372/50 |
| 2007/0041421 A1 | 2/2007 | Duncan et al. | | |

FOREIGN PATENT DOCUMENTS

KR    1020070017857 A    2/2007

OTHER PUBLICATIONS

International Search Report for PCT/KR2008/006014 filed on Oct. 13, 2008. Written Opinion of the International Searching Authority for PCT/KR2008/006014 filed on Oct. 13, 2008.
"Spatial Walk-off", Encyclopedia of Laser Physics and Technology, http://rp-photonics.com/spatial_walk_off.html, May 30, 2011.

* cited by examiner

*Primary Examiner* — Patrick Stafford

(57) ABSTRACT

The present invention relates to a green laser generation device which can be applied to a cellular phone, and more particularly to a green laser generation device which is ultra compact in size having volume of 1 cc or less, despite having a built-in thermo electric cooler, and has sufficient output power, despite having low power consumption, and a portable electronic machine having a laser projection display using the said device. The present invention provides a green laser generation device comprising an LD pump constituted by a photo diode; a fundamental generator generating infrared light laser according to the driving of the LD pump; a second harmonic generator generating green light using the generated infrared light laser; a polarization maintenance unit inserted between the fundamental generator and the second harmonic generator to maintain the polarization of the laser; and a temperature controller controlling an internal temperature of the green laser generation device.

12 Claims, 5 Drawing Sheets

[Fig. 1]
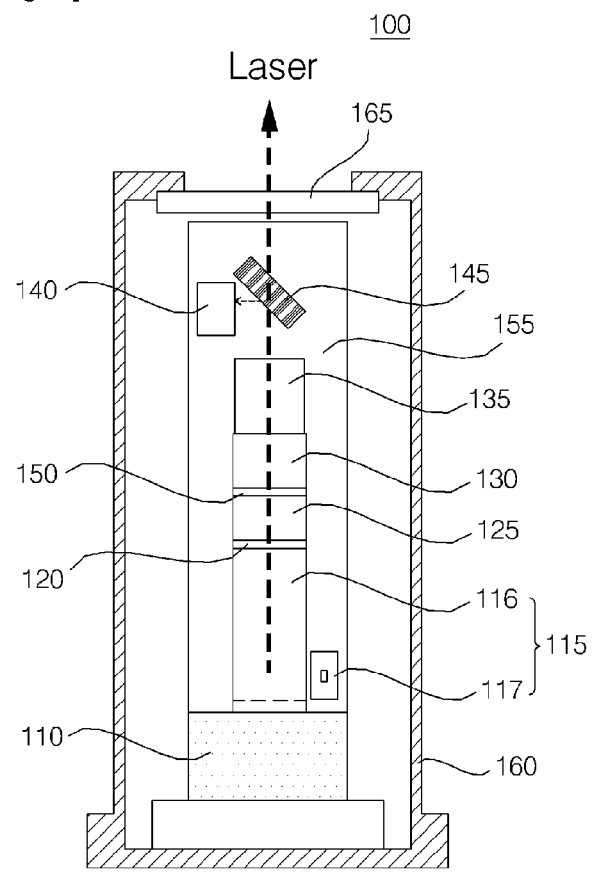
[Fig. 2]
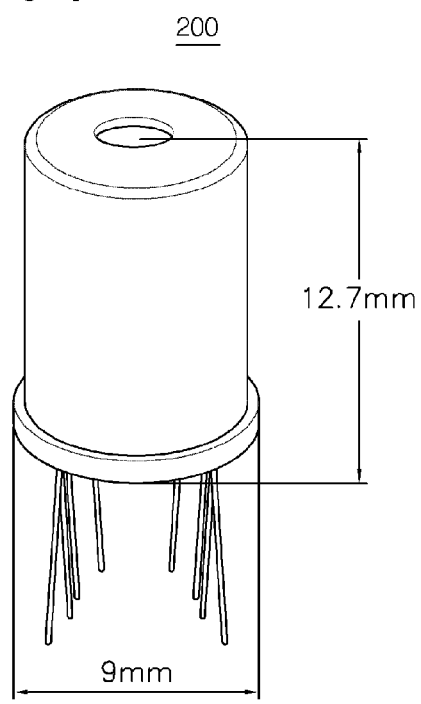

[Fig. 3]
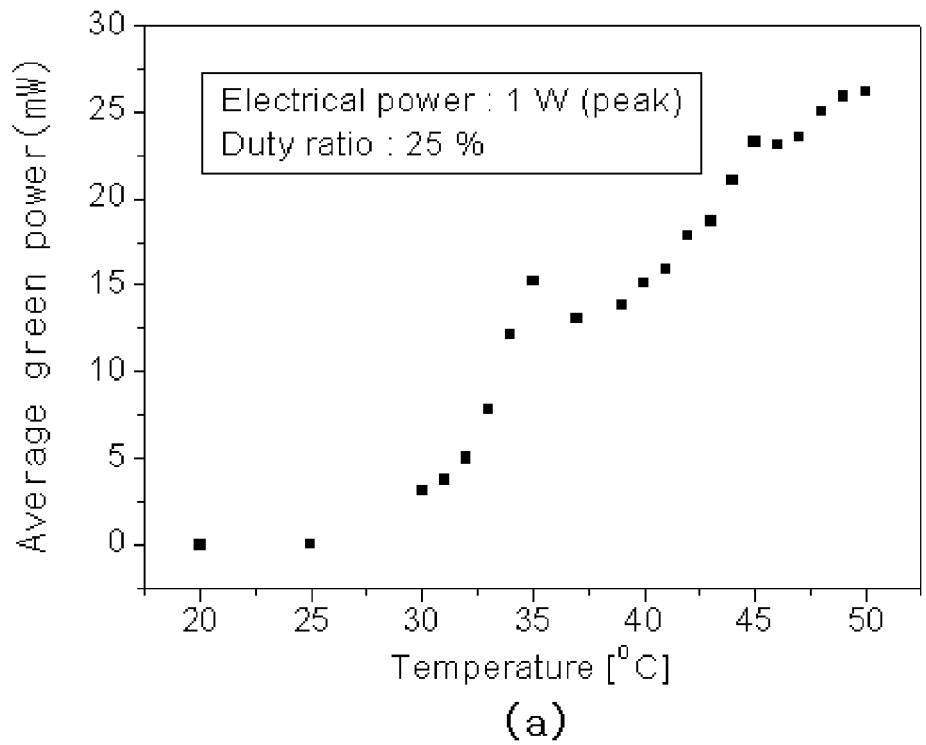
(a)
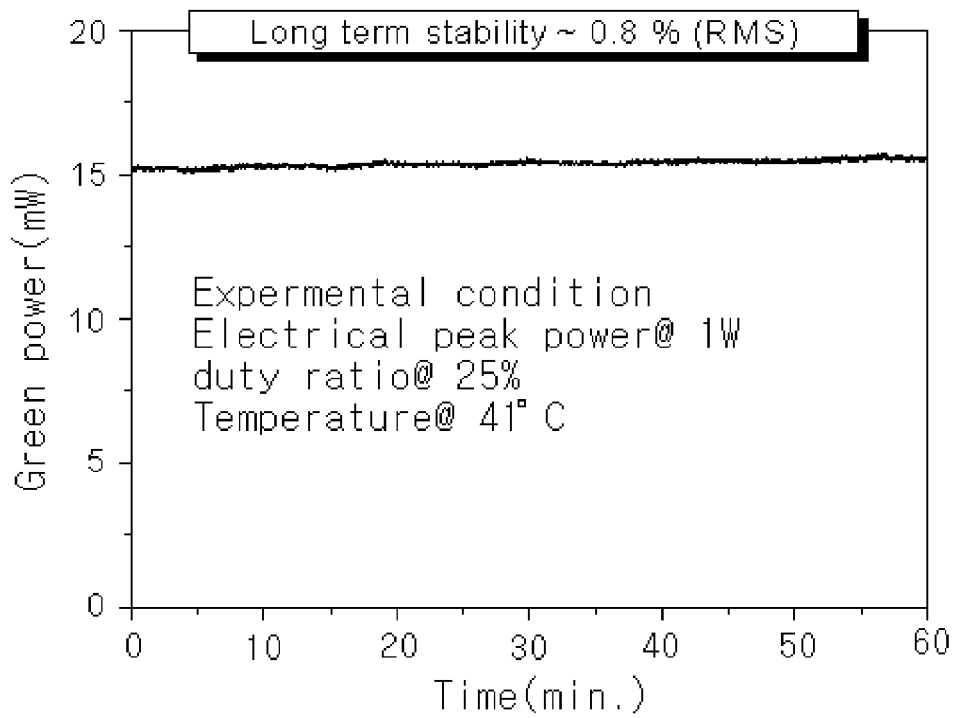
(b)

[Fig. 4]
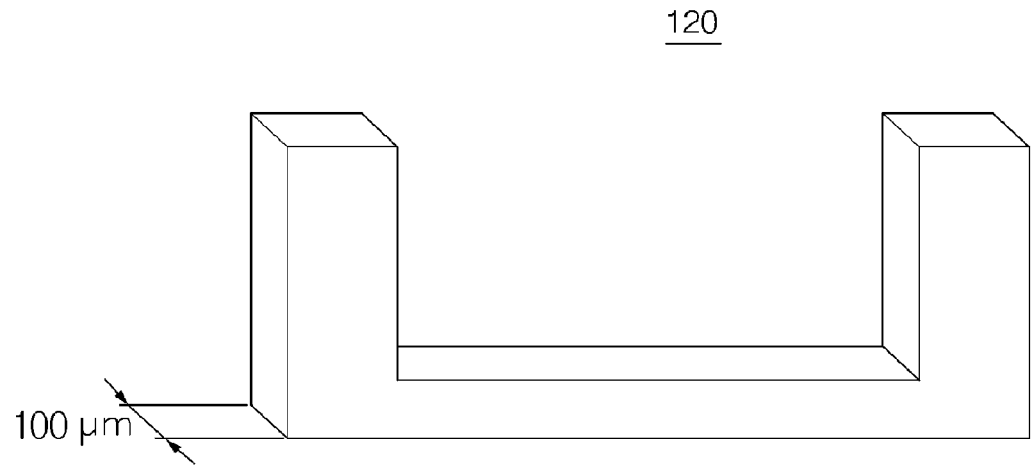
[Fig. 5]
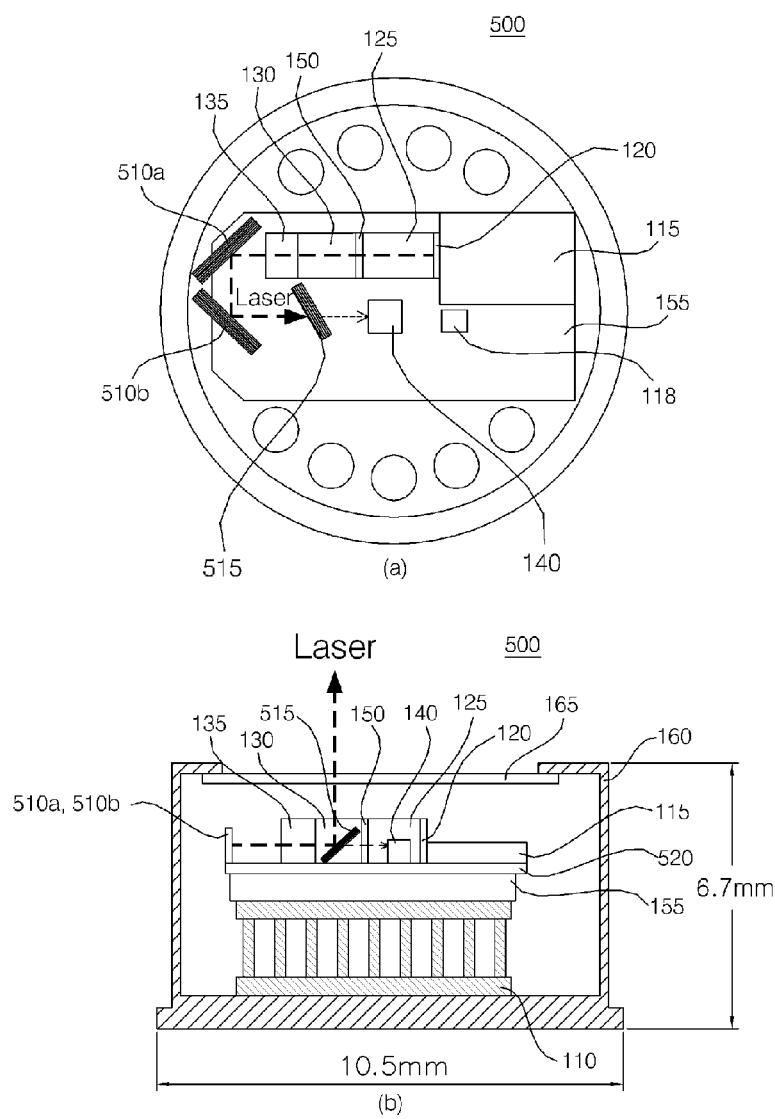

[Fig. 6]
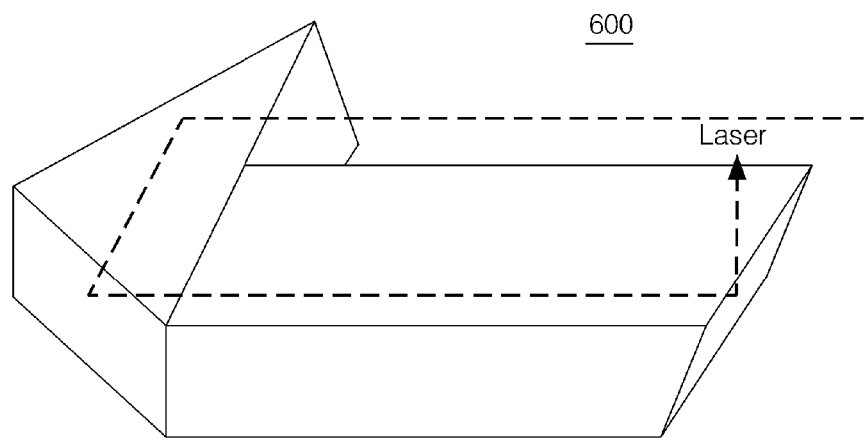
[Fig. 7]
(a)
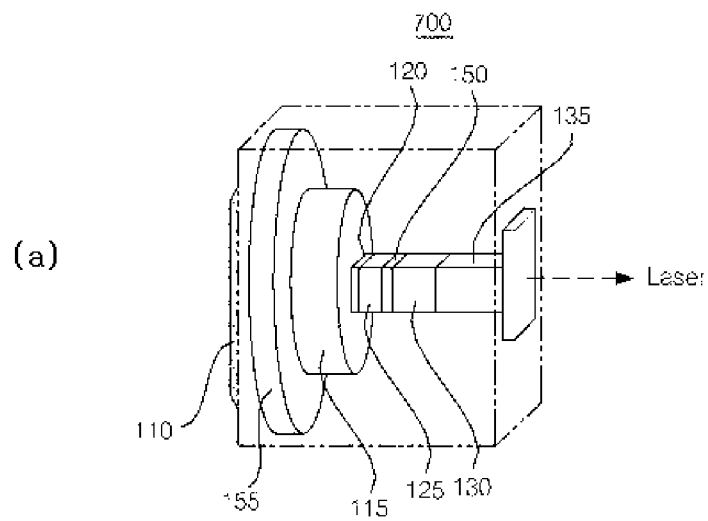
(b)
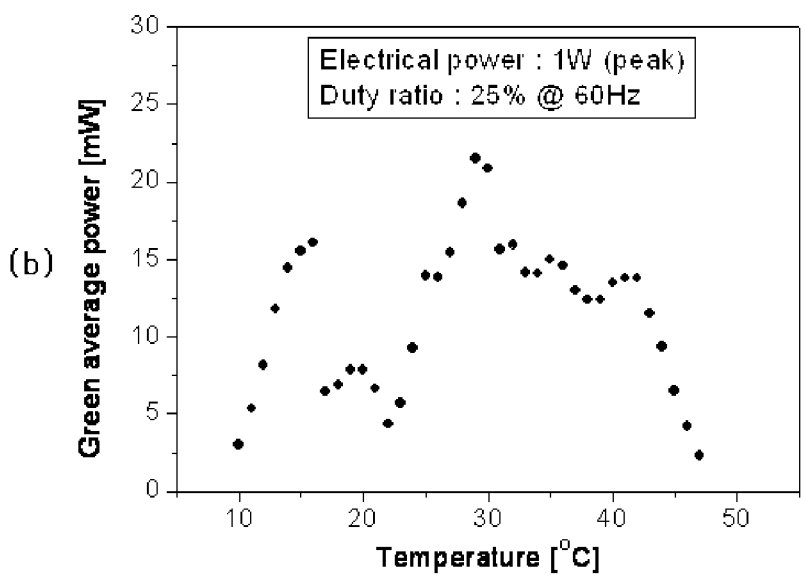

[Fig. 8]
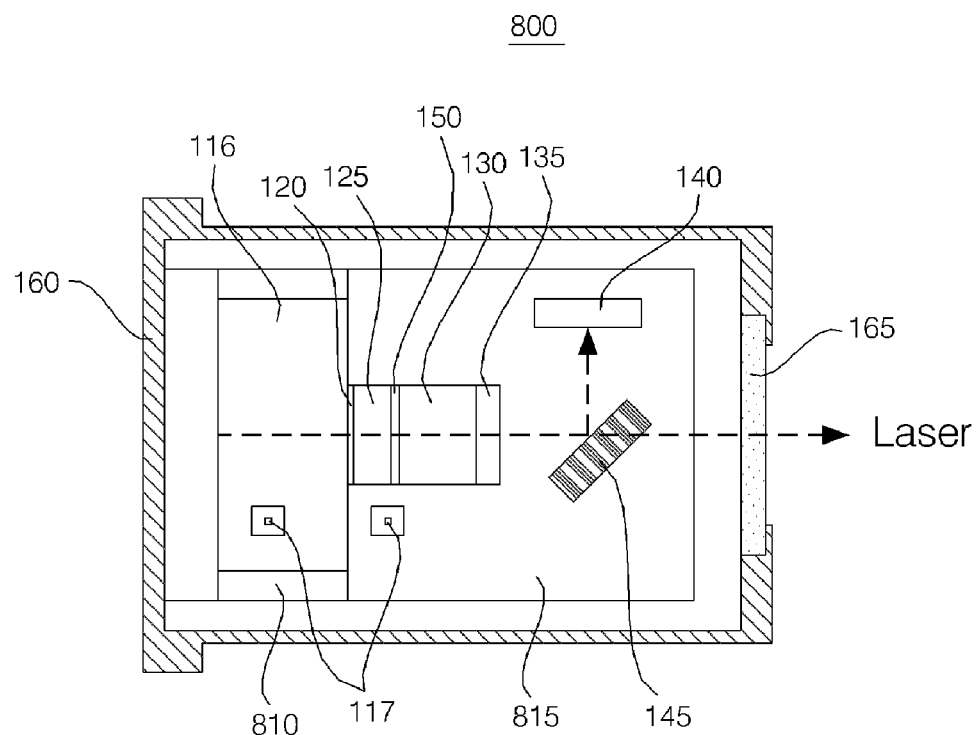
[Fig. 9]
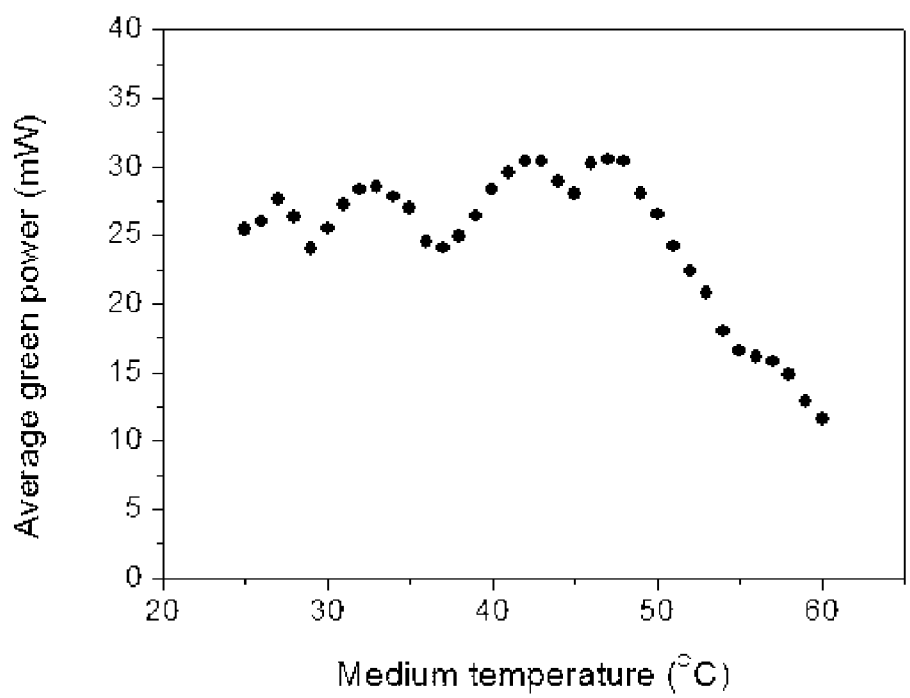

GREEN LASER GENERATION DEVICE, AND PORTABLE ELECTRONIC MACHINE HAVING LASER PROJECTION DISPLAY USING THE SAID DEVICE

TECHNICAL FIELD

The present invention relates to a green laser generation device, and a portable electronic machine having a laser projection display using the said device. More particularly, the present invention relates to a green laser generation device having thermo electric cooler (TEC) and generating green laser using laser diode (LD) as a pump light source and a portable electronic machine having a laser projection display (LPD) performing a projector using said device.

BACKGROUND ART

In general, the three primary colors of light such as red (R), green (G) and blue (B) are required in implementing a full color image. The three primary colors may be obtained by various methods, and in particular, a method using light, which has a very wide expression range of colors and the highest color sensitivity, is most commonly used. Therefore, there have been many laser projection displays using the method in the prior art.

A laser projection display largely includes respective laser light sources generating the three primary colors, a spatial modulator spatial-modulating laser generated from the respective laser light sources, diverse forms of optical systems, and drivers driving and controlling thereof. Although red light and blue light have been generally generated using a semiconductor laser, however, green light has not been directly generated using the semiconductor laser. Instead, as described in the related art, infrared light is generated by pumping a predetermined wavelength of light and is then converted into secondary harmonic light to generate green light.

With the recent distribution of various types of portable electronic machines, there is a demand for more compact laser projection displays. However, in order to implement the compact laser projection displays, the problem of low voltage should be solved. Also, a conventional light source for generating green light has been developed to be used as a pointer, such that is is very sensitive to temperature change. As a result, the operational characteristics of the light source are changed. In order to generate stable green light without being affected by temperature change, a thermo electric cooler (TEC) is provided and the TEC is generally mounted on the exterior of the portable electronic machines, while considering the problem of the size. However, the exterior shape of the TEC is still insufficient for providing stable temperature and fails to solve the problem of the size.

Meanwhile, the conventional module generating green light has a difficulty in maintaining polarization of the green light, such that it is almost in a non-polarized state.

DISCLOSURE OF INVENTION

Technical Problem

Therefore, in order to solve the above problems, it is an object of the present invention to provide a green laser generation device having a built-in thermo electric cooler (TEC), which is manufactured to have a size that can be insertable into a portable electronic machine, and a portable electronic machine having a laser projection display using the said device.

Also, it is another object of the present invention to provide a green laser generation device including any one of a green light absorber, a dichroic mirror and a multilayer thin film as a polarization maintenance module, and a portable electronic machine having a laser projection display using the said device.

Technical Solution

In order to accomplish the above object, the present invention provides a green laser generation device comprising: an LD pump configured by a photo diode; a fundamental generator generating infrared light laser according to the driving of the LD pump; a second harmonic generator generating green light using the generated infrared light laser; a polarization maintenance unit inserted between the fundamental generator and the second harmonic generator to maintain polarization of the laser; and a temperature controller controlling an internal temperature of the green laser generation device.

In addition, the present invention provides a portable electronic machine mounted with a green laser generation device or a laser projection display having the green laser generation device.

Advantageous Effects

With the present invention, the following effects can be obtained. First, a green laser generation device can be manufactured to have a size less than about 1 cc by disposing a thermo electric cooler at a proper location of the green laser generation device so that the green laser generation device is insertable into a portable electronic machine. Also, according to the structure described above, the green laser generation device can obtain a peak output of 100 mW or more, despite the power consumption of 1 watt.

Second, a green laser generation device includes any one of a green light absorber, a dichroic mirror and a multilayer thin film as a polarization maintenance module, making it possible to control the polarization state that can not be randomly changed and to be applied to an optical system for removing speckle noise required in implementing an image.

BRIEF DESCRIPTION OF THE DRAWINGS

FIG. 1 is a concept view that schematically illustrates a green laser generation device according to a first exemplary embodiment of the present invention;

FIG. 2 is a view of a green laser generation device that is actually implemented according to a first exemplary embodiment of the present invention;

FIG. 3 illustrates experimental results data of the green laser generation device of FIG. 2;

FIG. 4 is a view that illustrates a structure of a metal spacer in a green laser generation device according to a first exemplary embodiment of the present invention;

FIG. 5 is a concept view that schematically illustrates a green laser generation device according to a second exemplary embodiment of the present invention;

FIG. 6 is a concept view of a prism coupler provided in a green laser generation device according to a second exemplary embodiment of the present invention;

FIG. 7 is a concept view that illustrates a green laser generation device according to a third exemplary embodiment of the present invention;

FIG. 8 is a concept view that schematically illustrates a green laser generation device according to a fourth exemplary embodiment of the present invention; and FIG. 9 is a graph that illustrates an output change of a green laser generation device according to a fourth exemplary embodiment of the present invention.

BEST MODE FOR CARRYING OUT THE INVENTION

A green laser generation device according to the present invention includes: an LD pump configured by a photo diode; a fundamental generator generating infrared light laser according to the driving of the LD pump; a second harmonic generator generating green light using the generated infrared light laser; a polarization maintenance unit inserted between the fundamental generator and the second harmonic generator to maintain polarization of the laser; and a temperature controller controlling an internal temperature of the green laser generation device.

Preferably, the green laser generation device further includes a metal spacer inserted between the LD pump and the fundamental frequency generator so that the LD pump and the fundamental frequency generator maintain a predetermined interval. More preferably, the metal spacer includes an air gap and has a thickness of 100 μm or less.

Preferably, the green laser generation device further includes any one of a beam splitter formed to have a predetermined angle, excluding a horizontal angle or a vertical angle, in the progress direction of the green light generated by the second harmonic generator, at least one partial minor reflecting the green light generated by the second harmonic generator and an elevated mirror formed having an elevated angle so that the reflected green light is refracted in an upward direction, and a prism coupler including a stick type prism whose one surface is coupled to a triangle prism so that the green light generated by the second harmonic generator is emitted to the outside and the other surface is formed to have an elevated angle.

Preferably, the green laser generation device further includes a filter attached to a cross-section of the second harmonic generator to remove the fundamental frequency included in the green light generated by the second harmonic generator; and a photo diode positioned at any location of one side of the beam splitter, the rear of the elevated mirror, and the rear of the stick type prism of the prism coupler to measure the output of the received green light.

Preferably, the green laser generation device further includes a submount having thermal conductivity and is formed in a vertical type package structure, wherein the temperature controller, the LD pump, the fundamental frequency generator, the polarization maintenance unit and the second harmonic generator are sequentially arranged on the submount, or the green laser generation device further comprises a submount having thermal conductivity and is formed in a horizontal package structure where the temperature controller is formed on one side of the submount and the LD pump, the fundamental frequency generator, the polarization maintenance unit and the second harmonic generator are sequentially arranged on the other side of the submount.

Preferably, the polarization maintenance unit is formed by inserting a green light absorber or coating a dichroic mirror or a multilayer thin film.

Preferably, the LD pump is a submount type and has a thermistor measuring a heat temperature of the photo diode formed on one side of the submount or around the submount.

Preferably, the temperature controller is a thermo electric cooler (TEC). More preferably, two or more temperature controllers are provided. Still more preferably, when two temperature controllers are provided, one is attached to the fundamental frequency generator and the other is attached to the second harmonic generator.

A portable electronic machine according to the present invention is mounted with the green laser generation device or a laser projection display having the green laser generation device.

Preferably, the portable electronic machine is any one of a cellular phone, a projector, a game machine and a laser pointer.

MODE FOR THE INVENTION

Hereinafter, the exemplary embodiments of the present invention will be described in detail with reference to the accompanying drawings. First, wherever possible, the same reference numbers will be used throughout the drawings to refer to the same or like parts. Also, when explaining the present invention, if it is determined that the specific explanation on the related well-known constitution or function may make the gist of the present invention obscure, the detailed explanation thereof will be omitted. Also, although the exemplary embodiments of the present invention will be described hereinafter, the present invention may be changed in many different forms by those skilled in the art and should not be construed as limited to the embodiments set forth herein.

FIG. 1 is a concept view that schematically illustrates a green laser generation device according to a first exemplary embodiment of the present invention. Referring to FIG. 1, the green laser generation device 100 according to the first exemplary embodiment of the present invention includes a temperature controller 110, a laser diode (LD) pump 115, a metal spacer 120, a fundamental frequency generator 125, a second harmonic generator 130, a filter 135, a monitor photo diode 140, a beam splitter (BS) 145, and a copper block 155.

The green laser generation device 100 is characterized in that the temperature controller 110 controlling an internal temperature is built-in, different from known devices. As an example of a temperature controller 110, there is a thermo electric cooler (TEC). However, the green laser generation device 100 according to the present invention is manufactured to have a compact size so that the green laser generation device 100 can be built-in portable electronic machines such as a cellular phone. Therefore, the temperature controller 110 is preferably formed in a micro shape in consideration of the above feature. The micro temperature controller 110 may be manufactured with reference to "Process of Micro Thermo Electric Cooler (TEC), and Measurement and Analysis of Physical Properties" written by Seung-Woo Han et al. published in Machinery & Materials Vol. 17, No. 4 (Serial No. 66) issued on Jan. 25, 2006 by Korea Institute of Machinery & Materials.

The temperature controller 110 is attached to one side of the LD pump 115 in the embodiment of the present invention. Of course, the location of the temperature controller 110 is not limited thereto. For example, the temperature controller 110 may be attached to one surface of the copper block 155. In this case, other components are arranged on the other surface of the copper block 155.

The LD pump 115 serves to pump laser having a wavelength of 808 nm. Such a LD pump 115 is formed in the shape where a photo diode 116 is mounted on a submount (not shown). At this time, it is important that a length of the submount is set to be the same as the selected photo diode 116, and a thickness of the submount is set to solve the difference in thickness between the LD pump 115 and the fundamental frequency generator 125. Also, it is preferable to use copper material due to having good thermal conduction. Considering this feature, the LD pump 115 may adopt, for example, LU0808S250 manufactured by Lumics GmbH Co. Meanwhile, the LD pump 115 may have a thermistor 117 around the LD pump 115 in order to measure a heat temperature of the photo diode.

The metal spacer 120 is inserted to support between the LD pump 115 and the fundamental generator 125 in the embodiment of the present invention. Generally, it is known that a high output generation of the green light is possible when the interval between the LD pump 115 and the fundamental frequency generator 125 is narrow. However, according to the experimental results using the LU0808S250 manufactured by Lumics GmbH, the highest output of the green light is generated when the interval between the LD pump 115 and the fundamental frequency generator 125 is approximately 100 µm. Therefore, considering this feature, in the present invention, the metal spacer 120 is inserted between the LD pump 115 and the fundamental frequency generator 125 in order to maintain the interval of 50 µm to 100 µm. The reason why the size of the metal spacer 120 is set to 50 µm to 100 µm is that a vertical mode and a horizontal mode of the LD beam of 808 nm are similar in size, and also when the highest output of the green light is generated, such that the above condition is satisfied.

The metal spacer 120 may be inserted in various methods and the present invention uses a method to design the metal spacer 120 in an uneven-shaped U-structure and to attach it to one cross-section of the LD pump 115, as shown in FIG. 4. This method prevents physical damage between the LD pump 115 and the fundamental frequency generator 125, and allows the LD pump 115 to be mounted on the uneven structure having grooves to maintain the interval between the LD pump 115 and gain crystal. Also, this method allows a pump photo output from the LD pump 115 to be transferred right to the gain crystal in air.

In the present invention, the shape of the metal spacer 120 is not limited to the U structure, and may have different shapes if the metal spacer 120 includes an air gap. The metal spacer 120 is a structure that is inserted between the LD pump 115 and the gain crystal, such that metal materials such as copper or the like having high thermal conduction is preferably used for an efficient heat radiation.

The fundamental frequency generator 125 serves to generate infrared light having a wavelength at 1064 nm according to the operation of the LD pump 115. Such a fundamental frequency generator 125 preferably has Nd:YVO$_4$ as a gain crystal.

The second harmonic generator 130 serves to generate green light having a wavelength at 532 nm using infrared laser generated from the fundamental frequency generator 125. Such a second harmonic generator 130 has KTP as a gain crystal.

However, in the prior art, generally, a resonator structure where the fundamental frequency is resonated in a structure where the fundamental frequency generator 125 and the second harmonic generator 130 are joined is formed. In order to form the resonator structure, an anti-reflective coating having a thickness of 808 nm and a coating formed in a multilayer thin film in order to simultaneously have high reflexibility at 1064 nm and 532 nm, respectively, is performed on an incident surface of the fundamental frequency generator 125 to which light at 808 nm is incident from the LD pump 115. Continuously, a multilayer thin film coating having high reflection at 1064 nm and high transmittance at 532 nm is performed on a cross-section from which green light is emitted, at the end of the second harmonic generator 130. Therefore, a resonator structure incurs a problem when a polarization state causes the retroreflective at 1064 nm to return to the gain crystal is randomly changed. In order to solve such a problem and control and maintain polarization, the present invention includes a polarization maintenance unit 150 which maintains polarization by absorbing or reflecting green light between the fundamental frequency generator 125 and the second harmonic generator 130 to prevent the green light from being returned to the gain crystal.

There are two types of he polarization maintenance unit 150. The first type is a green light absorber layer, which prevents green light returned from being absorbed into the gain crystal by inserting a green light absorber layer, as will be described in the embodiment of the present invention below. The second type is a dichroic mirror layer formed by coating a dichroic mirror and preventing green light from entering the gain crystal by reflecting the green light, as in the embodiment of the present invention. Meanwhile, in the present invention, a multilayer thin film layer having selective transmittance characteristics may also be coated and formed, instead of the dichroic mirror layer.

The filter 135 serves to absorb and remove the fundamental frequency remaining after passing through the KTP crystal and allow only the generated second harmonic to be transmitted.

The beam splitter 145 serves to divide the green light passing through the filter 135 into two. Thereby, most green light transmits the beam splitter 145 to be emitted to the outside through the window 165, and some green light is reflected in the direction where the monitor photo diode 140 is provided by the beam splitter 145. To this end, the beam splitter 145 is formed to be slanted to the progress direction of the green light. Preferably, the beam splitter 145 is formed to have an angle of 45° in the progress direction of the green light. Meanwhile, when the green light arrives, the monitor photo diode 140 measures the output of the green light emitted using the green light.

The cooper block 155 serves to support the components constituting the green laser generation device 100. The copper block 155 is formed to have a sufficiently wide area and allows the metal spacer 120, the fundamental generator 125, the second harmonic generator 130, the filter 135, the monitor photo diode 140, the beam splitter 145 and the polarization maintenance unit 150 to be mounted on the copper block 155. Meanwhile, the copper block 155 has a AIN cover plate (not shown) on the surface on which the components 120 to 150 are mounted, making it possible to further improve thermal conductivity and thermal expansion compared to the prior art.

A case 160 is a member which holds the components 110 to 155 therein. Such a case 160 may be fabricated from Kovar material made of an alloy of Fe, Ni, Co or the like.

The green laser generation device 100 according to the first embodiment of the present invention as described above can be actually implemented as a To-can type as shown in FIG. 2. FIG. 2 shows an example of the green laser generation device 100 with a built-in temperature controller 110 formed in a vertical type package structure. As described above, the vertical type package structure is a structure where the temperature controller 110 is located at the bottom and the submount made of copper having good thermal conduction is vertically mounted on the temperature controller 110 and then, the LD pump 115, the metal spacer 120, the fundamental frequency generator 125, the polarization maintenance unit 150, the second harmonic generator 130, and the like are sequentially arranged.

As shown in FIG. 2, a green laser generation device 200 in a vertical type package structure, which has a total volume of 1 cc or less and a size (width×breadth) of 9 mm×12.7 mm, can be made to have a micro volume, which can be mounted on a portable electronic machine, such as a mobile phone. Further, referring to FIGS. 3A and 3B, the green laser generation device 100 according to the first embodiment of the present invention shows an average output of 27 mW when being driven in a pulse form at 48° C. according to an experimental result. Moreover, the beam pattern is shown in a TEMoo mode and the stability is 0.8% or less. It can be appreciated that the green laser generation device 100 according to the first embodiment of the present invention is excellent in view of the change in output and the stability according to temperature.

Meanwhile, the green laser generation device 100 according to the first embodiment of the present invention adopts a DPM scheme using a pump laser at 808 nm as a method that generates green light; however, the present invention is not necessarily limited thereto. The green laser generation device 100 can adopt a Quasi Phase Matching (QPM) scheme using a DFB laser at 1062 nm.

Also, the green laser generation device 100 according to the present invention can be formed in a horizontal type package structure with a built-in temperature controller 110. The horizontal type package structure is a structure where the submount made of copper is horizontally mounted on the temperature controller 110 and then, the LD pump 115, the metal spacer 120, the fundamental frequency generator 125, the polarization maintenance unit 150, the second harmonic generator 130, and the like are sequentially arranged. The green laser generation device in the horizontal type package structure is shown in FIG. 5. Hereinafter, a green laser generation device (hereinafter, referred to as "second green laser generation device") according to a second exemplary embodiment of the present invention having the horizontally type package structure will be described with reference to FIG. 5. FIG. 5A is a plan view of the green laser generation device and FIG. 5B is a side view of the green laser generation device.

A second green laser generation device 500 can effectively radiate heat by locating the copper block 155 on the temperature controller 110, wherein a silicon plate is further stacked on the copper block 155. In order to achieve a good optical arrangement of the LD pump 115, the metal spacer 120, the fundamental frequency generator 125, the polarization maintenance unit 150, the second harmonic generator 130, the filter 135, and the like, they can be more effectively arranged by additionally using the silicon plate 520, which is easily machined and is inexpensive, rather than directly arranging them on the copper block 155. However, the second green laser generation device 500 emits green light through a window 165 formed on the upper part of the case 160. This role is performed by an elevated minor 515 that is elevated to a predetermined angle (preferably, 45°, such that green light passing through the filter 135 should be guided to the elevated minor 515. In the second embodiment of the present invention, this role is performed by a first partial minor 510a and a second partial mirror 510b. The first partial mirror 510a and the second partial minor 510b are formed in a V-letter shape so as to change a course in an opposite direction. Thereby, as shown in FIG. 5A, after a course of green light is changed, the green light is emitted to the outside through the elevated mirror 515.

The first partial mirror 510a and the second partial mirror 510b perform a role of reflecting most of the green light in the second embodiment of the present invention. Preferably, the first partial mirror 510a and the second partial mirror 510b reflect green light of 90% or more. On the other hand, a rear of the elevated mirror 515 is provided with the monitor photo diode 140 so as to receive light that is not reflected but transmitted. Of course, the monitor photo diode 140 can perform the role at one side of the second partial minor 510b.

Meanwhile, in the second embodiment of the present invention, instead of the first partial mirror 510a, the second partial minor 510b, and the elevated minor 515, a prism coupler, which refracts green light and progresses it in an upward direction, can be provided. As shown in FIG. 6, in a prism coupler 600, a stick type prism has one surface that is coupled to a part of one surface of a triangle prism and the other surface whose upper surface or one side surface is inclinedly projected so that green light can be refracted.

Preferably, the second green laser generation device 500 smoothly emits internal heat, when is generated at the time of driving, to the outside through the case 160. As a result, in the second embodiment, the second green laser generation device is mounted using the copper block 155 having good heat conduction and the case 160 is completed using Kovar as a material. Further, the temperature controller 110 is provided between the inner surfaces of the case 160 and when the second green laser generation device is mounted on a mobile phone, since it has excellent heat conduction, the second green laser generation device shares a common heat sink to be attached to a main body of a mobile phone, together with the blue laser, the red laser, and the like.

As described above, when the second green laser generation device 500 is implanted as an actual product, its volume is about 0.6 cc and its size (width×breadth) is 10.5 mm×6.7 mm, such that it can be smaller than the green laser generation device 100 according to the first embodiment.

Further, in the green laser generation device according to the embodiment of the present invention, only the temperature controller 110 can be mounted on the outside of the case. In this case, a green laser generation device 700 can be configured as shown in FIG. 7A. The green laser generation device 700 shows an average power of 15 mW at 40° C. to 45° C. as shown in FIG. 7B.

Also, the green laser generation device according to the embodiment of the present invention, which is described with reference to FIGS. 1 to 7, can be mounted on a laser projection display, such that a portable electronic machine, such as a mobile phone, can be used as a laser projection display.

Meanwhile, the green laser generation device 100 according to the first embodiment of the present invention can include two or more temperature controllers that controls the internal temperature. Hereinafter, the green laser generation device including a plurality of temperature controllers will be described with reference to FIG. 8. FIG. 8 is a concept view that schematically illustrates a green laser generation device according to a fourth exemplary embodiment of the present invention.

According to FIG. 8, a green laser generation device 800 according to a fourth embodiment of the present invention includes two temperature controllers 810 and 815. Generally, in order to maximize the output of green light generated according to the DPM scheme, both of the absorption rate of pump beam in the fundamental frequency generator 125 and the harmonic conversion efficiency in the second harmonic generator 130 should be maximized. When considering the aspects in the fourth embodiment of the present invention, two temperature controllers 810 and 815 can be mounted as follows. In other words, the first temperature controller 810 has one side surface to which the photo diode 116 can be attached and the second temperature controller 815 has one side surface to which the fundamental frequency generator 125, the polarization maintenance unit 150, the second harmonic generator 130, the filter 135, the monitor photo diode 140, the beam splitter 145, and the like can be attached. When the green laser generation device 800 includes the temperature controller, the output efficiency of green light can be further maximized. Hereinafter, the reason will be described in detail.

As described above, in order to maximize the output of green light in the DPM scheme, both of the absorption rate of pump beam in the fundamental frequency generator 125 and the harmonic conversion efficiency in the second harmonic generator 130 should be maximized. However, both elements have been largely affected by temperature.

When the fundamental frequency generator 125 uses Nd:YVO$_4$, the maximum value of the absorption rate of beam can be obtained at a wavelength of 809 nm. At this time, a wavelength of a full width half maximum (FWHM) is narrow as about 2 nm. In this case, however, the wavelength of laser pumped in the photo diode 116 is changed at a rate of about 0.3 nm/° C. according to temperature. Therefore, when the green laser is used in the range of a wide temperature, it is preferable to include a separate temperature controller that can precisely control the internal temperature of the photo diode 116.

Meanwhile, the fundamental frequency beam having an infrared wavelength in the pumping laser according to the DMP scheme is resonated within a laser resonator, which is included in the second harmony generator 130, reciprocates between an input coupler and an output coupler. Thereby, the harmonic wave, which is progressed to the output coupler (hereinafter, it is defined by "forward direction") and the harmonic wave, which is progressed reversely thereto, are generated. However, the harmonic wave progressed in a reverse direction is reflected back; such that it encounters the harmonic wave progressed in a forward direction, resulting in an interference phenomenon between two harmonic waves. Since the optical length of the resonator is generally changed according to the change in temperature, the constructive interference and the offset interference repetitively occur. Further, since the second harmonic generator 130 generally uses KTP (for example, bulk KTP) as a gain medium, a crystal axis between the second harmonic generator 130 and the fundamental frequency generator 125 forms 45°. Thereby, a birefringence phenomenon occurs in the filter 135, such that the output of the green laser is vibrated and changed according the change in temperature. Moreover, in order to improve the harmonic conversion efficiency of the harmonic generator 130, it is preferable that the internal temperature of the second harmonic generator 130 has a predetermined difference with a phase matching temperature of the pumped laser.

As described above, several factors have an effect on the harmonic conversion efficiency according to the change in temperature of the second harmonic generator 130. Therefore, even in this case, it is preferable to include a separate temperature controller that can precisely control the internal temperature of the second harmonic generator 130.

Meanwhile, in the fourth embodiment of the present invention, the first temperature controller 810 and the second temperature controller 815 are generally mounted in parallel; however, the fourth embodiment is not limited thereto. Further, although the copper block is not mentioned, the copper block (not shown) can be of course attached to other side surfaces of two temperature controllers 810 and 815.

FIG. 9 is a graph illustrating an output change of a green laser generation device that is observed by changing only the temperature of the gain medium while the temperature of the photo diode 116 is fixed to 47° C., under the driving conditions, such as frequency of 60 Hz, duty ratio of 25%, power consumption of 1.36 W, and the like and the condition where the wavelength of the pumping laser is set to 809 nm. It can be appreciated from the graph that the temperature of the gain medium should be precisely controlled.

It will be apparent to those skilled in the art that various modifications and changes may be made without departing from the scope and spirit of the invention. Therefore, it should be understood that the above embodiment is not limitative, but illustrative in all aspects. The scope of the invention is defined by the appended claims rather than by the description preceding them, and therefore all changes and modifications that fall within metes and bounds of the claims, or equivalents of such metes and bounds are therefore intended to be embraced by the claims.

INDUSTRIAL APPLICABILITY

Since the green laser generation device according to the present invention has a volume of 1 cc or less and a power consumption of 1 W or less and is manufactured to be ultra compact in size, thus it can be applied to a portable terminal, such as a mobile phone, a projector using a laser, and a mini projector that is competitively developed and marketable throughout the world. Further, since the green laser generation device according to the present invention can emit strong light in a screen of 15 inches with a peak output of 100 mW while implementing images even though it has a mini size, it can be widely applied to a game machine requiring a fast signal process, a laser pointer requiring extended use time, a device implementing a mini type image, and the like. When the green laser generation device according to the present invention considers these aspects, it is expected that it will largely affect a display industry and its market will be largely expanded.

The invention claimed is:

1. A miniaturized green laser generation device which generates a green micro laser, comprising:
   an LD pump comprising a photo diode;
   a fundamental generator configured to generate infrared laser light according to the driving of the LD pump, the fundamental generator comprising an anisotropic gain crystal;
   a second harmonic generator configured to generate green light using the generated infrared laser light;
   a U-shaped metal spacer comprising a metal material and disposed between the LD pump and the fundamental frequency generator so that the LD pump and the fundamental frequency generator maintain a predetermined interval, wherein the metal spacer has a thickness of 50 μm to 100 μm; and
   a polarization maintenance unit disposed between the fundamental generator and the second harmonic generator and configured to prevent retrogressed light from entering the anisotropic gain crystal, wherein the polarization maintenance unit comprises an inserted green light absorber configured to absorb retrogressed green light, or a coated multilayer thin film configured to reflect the retrogressed green light.

2. The green laser generation device as set forth in claim 1, further comprising:
a temperature controller configured to control an internal temperature of the miniaturized green laser generation device.

3. The green laser generation device as set forth in claim 2, wherein the LD pump is a submount type, and further comprising a thermistor configured to measure a temperature of the photo diode.

4. The green laser generation device as set forth in claim 1, wherein the green laser generation device further comprises:
a thermally conductive submount formed in a vertical type package structure wherein the temperature controller, the LD pump, the fundamental frequency generator, the polarization maintenance unit and the second harmonic generator are arranged sequentially on the submount, or
a thermally conductive submount formed in a horizontal type package structure wherein the temperature controller is formed on a first side of the submount, and the LD pump, the fundamental frequency generator, the polarization maintenance unit and the second harmonic generator are arranged sequentially on a second side of the submount.

5. The green laser generation device as set forth in claim 1, further comprising at least one of:
a beam splitter comprising a surface disposed at a predetermined angle excluding a horizontal angle or a vertical angle to the progress direction of the green light generated by the second harmonic generator,
at least one partial mirror configured to reflect the green light generated by the second harmonic generator and an elevated mirror disposed at an elevated angle so that the reflected green light is refracted in an upward direction, and
a prism coupler including a stick prism and a triangle prism,
wherein a first surface of the stick prism is coupled to a first side of a rectangular surface of the triangle prism and a second surface of a stick type prism opposite the first surface is disposed at an angle, and
wherein a beam of green light entering a second side of the rectangular surface of the triangle prism is directed into the stick type prism through the first surface, and is refracted by the second surface of the stick type prism.

6. The green laser generation device as set forth in claim 5, further comprising:
a filter coupled to the second harmonic generator and configured to remove light of the fundamental frequency included in the green light generated by the second harmonic generator; and
a photo diode disposed on one side of the beam splitter, the rear of the elevated mirror, and the rear of the stick type prism of the prism coupler to measure the output of the received green light.

7. The green laser generation device as set forth in claim 2, wherein the temperature controller is a thermo electric cooler (TEC).

8. The green laser generation device as set forth in claim 2, wherein two or more temperature controllers are provided.

9. The green laser generation device as set forth in claim 8, wherein a first temperature controller is coupled to the fundamental frequency generator and a second temperature controller is coupled to the second harmonic generator.

10. A portable electronic machine comprising the green laser generation device of claim 1.

11. The portable electronic machine as set forth in claim 10, wherein the portable electronic machine is any one of a cellular phone, a projector, a game machine, and a laser pointer.

12. A laser projection display having the green laser generation device of claim 1.

* * * * *